US011639911B2

(12) United States Patent
Kummaraguntla et al.

(10) Patent No.: US 11,639,911 B2
(45) Date of Patent: May 2, 2023

(54) DETERMINING A TEMPERATURE COEFFICIENT VALUE OF A RESISTOR

(71) Applicant: Cirrus Logic International Semiconductor Ltd., Edinburgh (GB)

(72) Inventors: Ravi K. Kummaraguntla, Austin, TX (US); Kathryn R. Holland, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 23 days.

(21) Appl. No.: 17/185,514

(22) Filed: Feb. 25, 2021

(65) Prior Publication Data
US 2022/0268721 A1 Aug. 25, 2022

(51) Int. Cl.
*G01N 27/14* (2006.01)
*G01R 19/00* (2006.01)

(52) U.S. Cl.
CPC ......... *G01N 27/14* (2013.01); *G01R 19/0092* (2013.01)

(58) Field of Classification Search
CPC ............................ G01R 19/0092; G01N 27/14
See application file for complete search history.

(56) References Cited

U.S. PATENT DOCUMENTS

| 8,920,026 | B2* | 12/2014 | Lazarov ............... | G01R 19/00 374/170 |
| 9,429,605 | B2* | 8/2016 | Popa ..................... | G01R 27/00 |
| 10,795,390 | B1* | 10/2020 | Philbrick ............... | H02M 1/00 |
| 2011/0170258 | A1* | 7/2011 | Single .................... | B25F 5/008 361/752 |
| 2012/0218022 | A1* | 8/2012 | Lazarov ................. | G01R 19/00 327/362 |
| 2013/0249518 | A1* | 9/2013 | Giannopoulos ....... | H02M 3/156 323/284 |
| 2014/0354266 | A1* | 12/2014 | Hurwitz ................ | G01R 19/0092 324/140 R |

FOREIGN PATENT DOCUMENTS

| DE | 2347169 A1 | 3/1975 |
| RU | 2167429 C1 | 5/2001 |

OTHER PUBLICATIONS

Combined Search and Examination Report under Sections 17 and 18(3), UKIPO, Application No. GB2103773.4, dated Nov. 26, 2021.
International Search Report and Written Opinion of the International Searching Authority, International Application No. PCT/GB2022/050133, dated Apr. 7, 2022.
Anonymous: Resistive Products—Application Note: Thermal Management in Surface-Mounted Resistor Applications, Vishay Beschlag's corporate website, Jun. 25, 2012, pp. 1-6, Heide, Schleswig-Holstein (Germany).

* cited by examiner

*Primary Examiner* — Dominic E Hawkins
(74) *Attorney, Agent, or Firm* — Jackson Walker L.L.P.

(57) ABSTRACT

The present disclosure relates to circuitry for determining a temperature coefficient value of a resistor. The circuitry comprises circuitry for supplying an AC current signal to the resistor, circuitry for measuring a first voltage across the resistor when the AC current signal is supplied; and processing circuitry configured to determine the temperature coefficient value based on the first voltage.

29 Claims, 7 Drawing Sheets

DETERMINING A TEMPERATURE COEFFICIENT VALUE OF A RESISTOR

FIELD OF THE INVENTION

The present disclosure relates to circuitry for determining a temperature coefficient value of a resistor, and in particular to circuitry for determining a temperature coefficient value for a current sense resistor, e.g. a current sense resistor that is integrated into an integrated circuit. The present disclosure further relates to circuitry for determining a thermal resistance value of a junction surrounding a resistor.

BACKGROUND

It is often desirable to monitor the current flowing in an electronic circuit, e.g.to determine or estimate the power consumption of the circuit. A typical approach for monitoring current is to use current monitoring circuitry of the kind illustrated in FIG. 1.

The current monitoring circuitry (shown generally at 100 in FIG. 1) includes a current sense resistor 110 in a signal path in which current is to be monitored. In the example illustrated in FIG. 1 the current sense resistor 110 is provided in a signal path between a supply voltage Vin and some downstream circuitry 120 that is powered by the supply voltage Vin.

The current monitoring circuitry 100 further comprises processing circuitry 160, which in this example includes differential amplifier circuitry 130 having a first input coupled to a first node 112 of the current sense resistor 110, at which the supply voltage Vin is received. A second input of the differential amplifier circuitry 130 is coupled to a second node 114 of the current sense resistor 110, which is coupled to the downstream circuitry 120 to supply a voltage Vout to the downstream circuitry 120.

The differential amplifier circuitry 130 outputs an analogue voltage signal that represents a voltage drop across the current sense resistor 110 (i.e. the difference between Vout and Vin) to analogue to digital converter (ADC) circuitry 140. The ADC circuitry 140 outputs a digital signal indicative of the voltage drop across the current sense resistor 110 to digital signal processing (DSP) circuitry 150. The DSP circuitry 150 is configured to determine and output a signal Imon indicative of the current through the current sense resistor 110 based on the digital signal indicative of the voltage drop across the current sense resistor 110 and a nominal resistance value of the current sense resistor 110.

Such current monitoring circuitry may be used to monitor the current in an integrated circuit (IC). As shown in FIG. 2, an IC 200 may thus include the amplifier circuitry 130, ADC circuitry 140 and DSP circuitry 150 of the current monitor circuitry of FIG. 1, together with the downstream circuitry 120.

In the example illustrated in FIG. 2, the current sense resistor 110 is provided externally of the IC 200. However, this arrangement requires additional contacts 202, 204 are on the IC for receiving the Vin and Vout signals from the sense resistor terminals 112, 114. Further, providing an external current sense resistor 110 may add cost to a system that includes the IC 200.

To mitigate these issues, a current sense resistor 310 may be integrated into the IC, as shown generally at 300 in FIG. 3.

SUMMARY

According to a first aspect, the invention provides circuitry for determining a temperature coefficient value of a resistor, the circuitry comprising:

circuitry for supplying an AC current signal to the resistor;

circuitry for measuring a first voltage across the resistor when the AC current signal is supplied; and processing circuitry configured to determine the temperature coefficient value based on the first voltage.

The resistor may be an integrated resistor of an integrated circuit, for example.

The processing circuitry may be configured to determine the temperature coefficient value based on a thermal resistance value of a junction surrounding the resistor and a harmonic distortion value of the first voltage.

The harmonic distortion value may be, for example, a third harmonic distortion value or a second harmonic distortion value.

In some examples, the thermal resistance value may be a predefined value based on material properties of the junction.

The circuitry may further comprise:

circuitry for supplying a DC current signal to a resistive element for a predefined period of time to dissipate power in the resistive element; and circuitry for measuring a second voltage across the resistive element when the DC current signal is supplied, wherein the processing circuitry is further configured to estimate a power dissipated by the resistive element in the predetermined period of time based on the second voltage.

The processing circuitry may be further configured to estimate the power dissipated by the resistive element in the predetermined period of time based on the second voltage and a resistance value of the resistive element.

The processing circuitry may be further configured to estimate a thermal resistance value of a junction surrounding the resistor based on the estimated power dissipated and a measured change in a temperature in the vicinity of the resistor over the predefined period of time.

The processing circuitry may be configured to determine the temperature coefficient value based on the estimated thermal resistance value and the first voltage.

The resistive element may comprise the resistor.

The AC current signal may comprise a sinusoidal current signal.

The DC current signal may comprise a signal of a constant amplitude.

The circuitry may comprise temperature sensing circuitry configured to output one or more signals indicative of the measured change of temperature to the processing circuitry.

The temperature sensing circuitry may comprises one or more of:

a resistor having a known temperature coefficient;

a diode; and a transistor.

A temperature to resistance transfer function of the resistor may comprises a polynomial function comprising a plurality of different temperature coefficients, each associated with a polynomial term of the polynomial function.

According to a second aspect, the invention provides circuitry for determining a thermal resistance value of a junction surrounding a resistor, the circuitry comprising:

circuitry for supplying a DC current signal to a resistive element for a predefined period of time to dissipate power in the resistive element; and circuitry for measuring a voltage across the resistive element when the DC current signal is supplied, wherein the processing circuitry is further configured to estimate a power dissipated by the resistive element in the predetermined period of time based on the measured voltage.

The processing circuitry may be further configured to estimate the power dissipated by the resistive element in the predetermined period of time based on the measured voltage and a resistance value of the resistive element.

The processing circuitry may be further configured to estimate a thermal resistance value of the junction surrounding the resistor based on the estimated power dissipated and a measured change in a temperature in the vicinity of the resistive element over the predefined period of time.

The resistive element may comprise the resistor.

The DC current signal may comprise a signal of a constant amplitude.

The resistor may be an integrated resistor of an integrated circuit.

According to a third aspect, the invention provides a method for determining a temperature coefficient value of a resistor, the method comprising:
 supplying an AC current signal to the resistor;
 measuring a first voltage across the resistor when the AC current signal is supplied; and
 determining the temperature coefficient value based on the first voltage.

The method may further comprise:
 determining a temperature associated with the resistor; and estimating a resistance value of the resistor at the determined temperature based on a reference resistance value of the resistor, the determined temperature, and the temperature coefficient value.

The resistor may be a current sense resistor of current sense circuitry, and the method may further comprise dynamically calibrating the current sense circuitry based on the estimated resistance value at the determined temperature.

The method may further comprise estimating a current through the resistor based on the estimated resistance value at the determined temperature.

According to a fourth aspect, the invention provides a method for determining a thermal resistance value of a junction surrounding a resistor, the method comprising:
 supplying a DC current signal to a resistive element for a predefined period of time to dissipate power in the resistive element;
 measuring a second voltage across the resistive element when the DC current signal is supplied; and
 estimating a power dissipated by the resistive element in the predetermined period of time based on the second voltage.

According to a fifth aspect, the invention provides integrated circuit comprising circuitry according to the first aspect.

The integrated circuit may further comprise an integrated current sense resistor.

According to a sixth aspect, the invention provides integrated circuit comprising circuitry according to the second aspect.

The integrated circuit may further comprise an integrated current sense resistor.

According to a sixth aspect, the invention provides an electronic device comprising an integrated circuit according to the fifth or sixth aspect.

The electronic device may comprise, for example, a mobile telephone, a tablet or laptop computer, a wearable device, a gaming device, a virtual reality or augmented reality device.

BRIEF DESCRIPTION OF THE DRAWINGS

Embodiments of the invention will now be described, strictly by way of example only, with reference to the accompanying drawings, of which.

DETAILED DESCRIPTION

Figure 3:
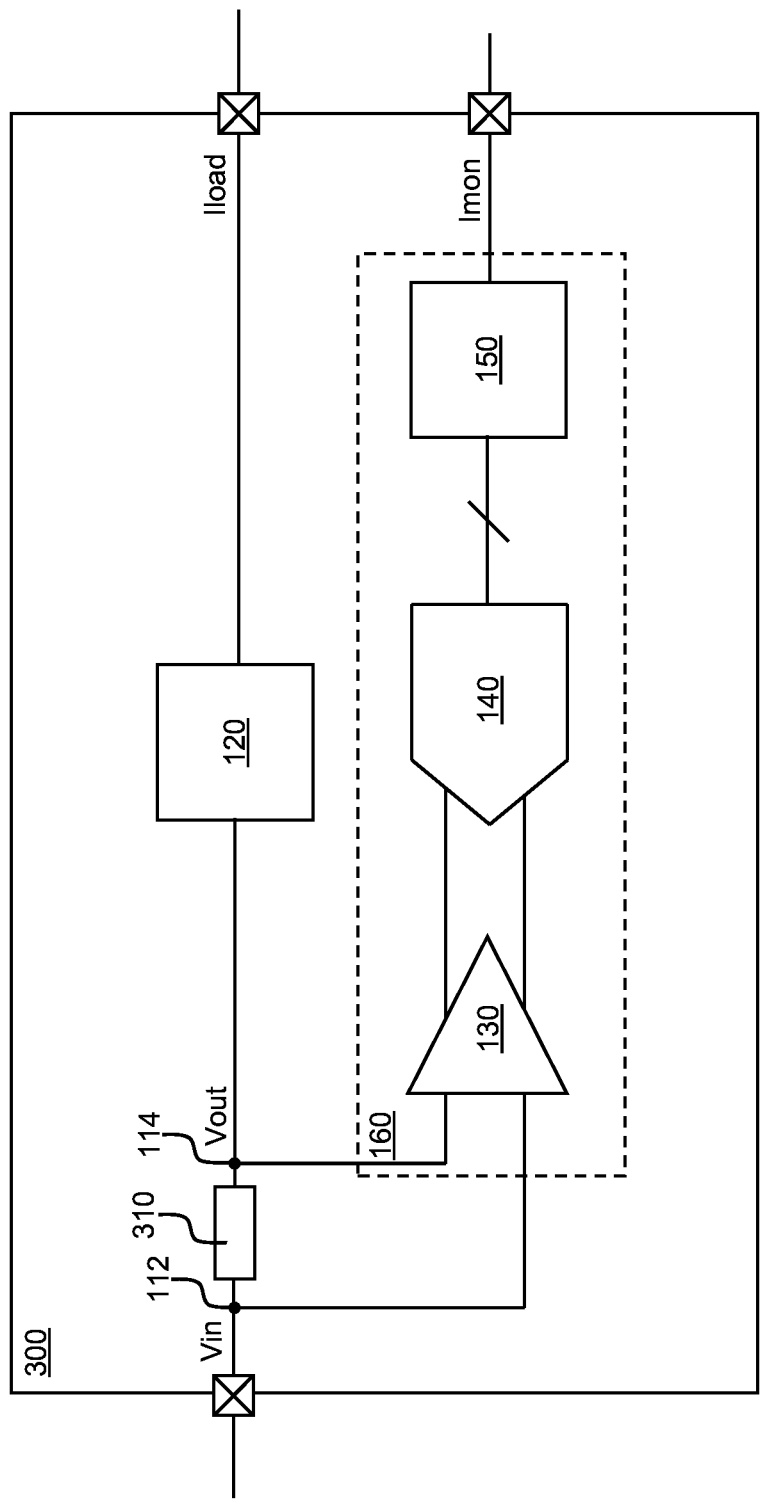
FIG. 3 is a schematic diagram illustrating an integrated circuit with current monitoring circuitry and an integrated current sense resistor.

As shown in FIG. 3, a current sense resistor 310 can be integrated, along with processing circuitry 160 (e.g. amplifier circuitry 130, ADC circuitry 140 and DSP circuitry 150) into an integrated circuit (IC) 300, such that the IC 300 includes an integrated current sensing system. The IC 300 further includes circuitry 120, which may be, for example, power converter circuitry. Thus, in the illustrated example the IC 300 may be a power management IC.

However, this arrangement can give rise to difficulties in accurately determining the current through the current sense resistor 310, because the resistance of the integrated current sense resistor 310 varies with temperature. Thus as the temperature of a die which implements the current sense resistor 310 and the circuitry 120-150 of the IC 300 changes, the resistance value of the current sense resistor 310 diverges from its nominal resistance value, which can lead to inaccuracy in the value represented by the signal Imon output by the DSP circuitry 150.

As will be appreciated by those of ordinary skill in the art, during operation of an integrated circuit such as the IC 300, power dissipated by the circuitry (e.g. circuitry 120) implemented by the die of the IC can cause a temperature of the die to change (e.g. increase). For example, in a power management IC the integrated sense resistor 310 may be positioned adjacent or close to power converter circuitry. The power dissipated by the power converter circuitry changes significantly with a load current Iload drawn by a load coupled to the IC 300, causing changes to the die temperature and thus to the resistance value of the sense resistor 310, which can affect the accuracy of the current value represented by the signal Imon.

Further, since the load current Iload flows through the current sense resistor 310, the power dissipated by the current sense resistor 310 itself creates a local temperature gradient in the vicinity of the current sense resistor 310 (e.g. in a region of the IC die around the current sense resistor 310), which causes the current sense resistor 310 to "see" an even greater change in the junction temperature (where junction temperature is the temperature of the region surrounding the resistor), which can lead to greater inaccuracy in the value represented by the signal Imon.

Additionally, changes in the ambient temperature in the vicinity of the IC can also cause the temperature of the IC die to increase or decrease, which can in turn further alter the junction temperature of the current sense resistor 310.

Ultimately the accuracy of the current value represented by the signal Imon output by the processing circuitry 160 of the integrated current sense system is limited by the temperature coefficient $\alpha$ of the current sense resistor 310, i.e. the relative change in the resistance value of the current sense resistor 310 for a given change in its temperature.

To minimise the effects of temperature changes on the accuracy of this current value, the sense resistor 310 is typically implemented such that its temperature coefficient is small. However, since the temperature coefficient $\alpha$ of the current sense resistor 310 is dependent upon the material properties and process steps involved in fabricating the current sense resistor 310, differences in the temperature coefficient $\alpha$ of the current sense resistor 310 between dies can be significant.

One approach to solving the problem of non-uniformity in the temperature coefficient of the current sense resistor 310 between IC dies would be to measure the temperature coefficient $\alpha$ of the current sense resistor 310 on each die and implement a per-die calibration during a production test phase of the production of the dies. However, such an approach would require heating and cooling capabilities in the production environment, which would increase the time and cost of manufacturing the IC 300.

Figure 4:
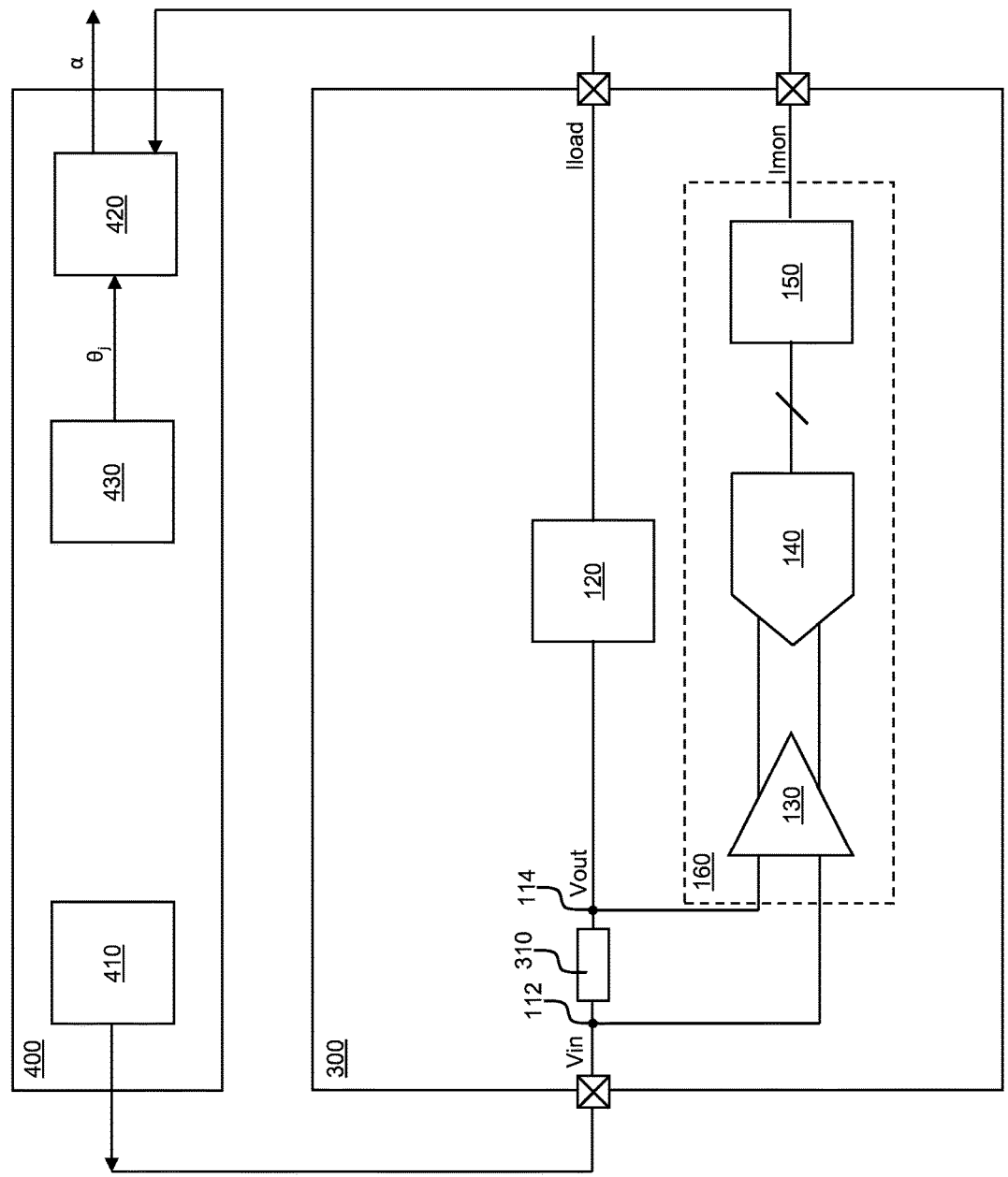
FIG. 4 is a schematic diagram illustrating an integrated circuit of the kind illustrated in FIG. 3 and circuitry for determining or estimating a temperature coefficient of the current sense resistor.

FIG. 4 is a schematic diagram illustrating an alternative approach to determining the temperature coefficient $\alpha$ of the integrated current sense resistor 310 of an integrated circuit 300 of the kind described above with reference to FIG. 3.

As shown in FIG. 4, circuitry 400 for determining a temperature coefficient of the integrated current sense resistor 310 includes signal generator circuitry 410 and processing circuitry 420.

The circuitry 400 may be provided externally of the IC 300 as shown in FIG. 4. For example, the circuitry 400 may be provided in an IC that is separate from the IC 300. Alternatively, the circuitry 400 may be integrated with the current sense resistor 310 and the circuitry 120-160 in the IC 300.

The signal generator circuitry 410 is configured to supply an alternating current (AC) signal, e.g. a sinusoidal current signal, of a predetermined peak amplitude I to the current sense resistor 310 of the integrated circuit 300.

The processing circuitry 420 is configured to receive the signal Imon and a signal indicative of a thermal resistance $\theta_j$ of the junction surrounding the current sense resistor 310, and to generate a signal indicative of a temperature coefficient $\alpha$ of the current sense resistor 310.

When a sinusoidal current is provided by the signal generator circuitry 410 to the current sense resistor 310, the power dissipated by the current sense resistor 310 is given by $$P_d = I_{rms}^2 R, \quad (1)$$

where $I_{rms}$ is the root mean square value of the current provided to the current sense resistor 310, and R is the nominal resistance value of the current sense resistor 310. As the peak amplitude I of the sinusoidal current signal output by the signal generator circuitry 410 is predetermined, the processing circuitry 420 is able to calculate $I_{rms}^2$. The nominal resistance value R of the current sense resistor 310 is known. Thus the processing circuitry 420 is able to calculate $P_d$.

If the thermal resistance of the junction surrounding the current sense resistor 310 is given by $\theta_j$ the junction temperature of the resistor $T_j$ can be approximated to be $$T_j = T_a + (\theta_j \times P_d), \quad (2)$$

where $T_a$ is the ambient temperature of the IC die.

If the current sense resistor 310 has a temperature coefficient given by $\alpha$, its resistance at any temperature $T_2$ can be approximated to be $$R_{T2} = R_{T1}(1 + \alpha \Delta T), \quad (3)$$

where $R_{T2}$ is the resistance at the temperature of interest, $R_{T1}$ is the resistance measured at a known temperature (e.g. room temperature) and $\Delta T$ is the difference between the two temperatures.

In general, the resistance value of a resistor varies non-linearly with temperature, but equation (3) above provides a reasonable approximation for small changes in temperature. Using equations (2) and (3) shown above, the resistance at a junction temperature $T_j$ can be calculated using the resistance at temperature $T_a$:

$$R_{Tj} = R_{Ta}(1 + \alpha(T_j - T_a)) \quad (4)$$

$$T_j - T_a = \theta_j \times P_d \quad (5)$$

$$R_{Tj} = R_{Ta}(1 + \alpha \theta_j P_d) \quad (6)$$

$$P_d I_{rms}^2 \times R_{Ta} \quad (7)$$

$$R_{Tj} = R_{Ta}(1 + R_{Ta}(\alpha \theta_j I_{rms}^2)) \quad (8)$$

$$R_{Tj} = R_{Ta} + R_{Ta}^2(\alpha \theta_j I_{rms}^2) \quad (9)$$

When the sinusoidal current signal of peak amplitude I supplied by the signal generator circuitry 410 passes through the current sense resistor 310, the voltage $V_{Rj}$ across the current sense resistor 310 at a junction temperature $T_j$ can be calculated as:

$$V_{Rj} = I \sin \omega t \times R_{Tj} \quad (10)$$

where $R_{Tj}$ is the resistance of the current sense resistor 310 at a junction temperature $T_j$ and $\omega$ is the angular frequency of the sinusoidal current signal.

Inserting equation (9) into equation (10):

$$V_R = I \sin \omega t \times [R_{Ta} + R_{Ta}^2 \alpha \theta_j (I \sin \omega t)^2] \quad (11)$$

$$V_{Rj} = [I \sin \omega t \times R_{Ta}] + [R_{Ta}^2 \alpha \theta_j (I \sin \omega t)^3] \quad (12)$$

Using trigonometric identities, this can be expanded to $$V_{Rj} = [I \sin \omega t \times R_{Ta}] + \left[ I^3 \times R_{Ta}^2 \alpha \theta_j \times \frac{(3 \sin \omega f - \sin 3 \omega f)}{4} \right] \quad (13)$$

$$V_{Rj} = \left[ \left( I \cdot R_{Ta} + \frac{3I^3}{4} R_{Ta}^2 \alpha \theta_j \right) \sin \omega t \right] - \left[ \frac{I^3 \cdot R_{Ta}^2 \cdot \alpha \cdot \theta_j}{4} \sin 3 \omega t \right] \quad (14)$$

-continued $$V_{Rj} \sim [(I.R_{Ta})\sin\omega t] - \left[\frac{I^3.R_{Ta}^2.\alpha.\theta_j}{4}\sin 3\omega t\right] \quad (15)$$

The term $(I.R_{Ta}) \sin \omega t$ in equation (15) above represents the amplitude of the fundamental frequency component of the voltage $V_{Rj}$, while the term $$\frac{I^3.R_{Ta}^2.\alpha.\theta_j}{4}\sin 3\omega t$$

represents the amplitude of the third harmonic frequency component of the voltage $V_{Rj}$.

The third harmonic distortion value is the ratio of the amplitude of the third harmonic frequency component to the amplitude of the fundamental frequency component, i.e.:

$$HD_3 = \frac{\text{Amplitude of 3rd harmonic}}{\text{Amplitude of Fundamental}} = \left[\frac{I^2.R_{Ta}.\alpha.\theta_j}{4}\right] \quad (16)$$

Thus, if a sinusoidal current signal of a known peak amplitude I is injected into the current sense resistor 310 and the nominal resistance value R of the sense resistor (represented by $R_{Ta}$ in equation (16) above) is known, the product of the temperature coefficient α of the current sense resistor 310 and the thermal resistance $\theta_j$ of the junction around the current sense resistor 310 can be estimated from the third harmonic distortion value of the measured voltage across the current sense resistor 310, as:

$$\alpha.\theta_j = \frac{4HD_3}{I^2.R_{Ta}} \quad (17)$$

Thus, the processing circuitry 420 is operative to estimate, calculate or otherwise determine a value for the third harmonic distortion of the voltage across the current sense resistor 310 based on the signal Imon output by the DSP circuitry 150. Then, based on equation (17) above, the processing circuitry 420 can determine a value for the temperature α.

The processing circuitry 420 may, alternatively or additionally, estimate, calculate or otherwise determine a value for the second harmonic distortion of the voltage across the sense resistor 310, and may then determine a value for the temperature coefficient α based on, for example, an equation similar to equation (17) that relates the product of the temperature coefficient α and the thermal resistance $\theta_j$ to the second harmonic distortion value.

In some examples the relative phase of the measured harmonic frequency components of the voltage $V_{Rj}$ may be used by the processing circuitry 420 to estimate the polarity (positive or negative) of the temperature coefficient.

The temperature coefficient α of the resistor under test (i.e. resistor 310 in the example of FIG. 4) may not necessarily be singular. Instead, the relationship between the resistance of the resistor and the temperature (e.g. a temperature vs. resistance curve or, equivalently, a temperature to resistance transfer function) could be a polynomial function. (The temperature-resistance relationship or transfer function is typically a second order polynomial relationship in practice). Thus the overall temperature coefficient α may comprise a plurality of different temperature coefficients $\alpha_1$, $\alpha_2$, ..., $\alpha_n$, each associated with a polynomial term of the polynomial function (e.g. one temperature coefficient for the linear contribution to the temperature-resistance relationship, another temperature coefficient for the squared contribution, another temperature coefficient for the polynomial contribution, etc.). The techniques described herein can be used to determine each of these different temperature coefficient contributors $\alpha_1$, $\alpha_2$, ..., $\alpha_n$.

In the example illustrated in FIG. 4, the thermal resistance a of the junction around the current sense resistor 310 is provided to the processing circuitry 420, e.g. from a memory 430 of the circuitry 400 or of a host device incorporating the IC 300 and the circuitry 400. For example, a value for the thermal resistance $\theta_j$ may be estimated from the material properties of the junction and the estimated thermal resistance value may be programmed into the memory during manufacture of the circuitry 400.

Figure 5:
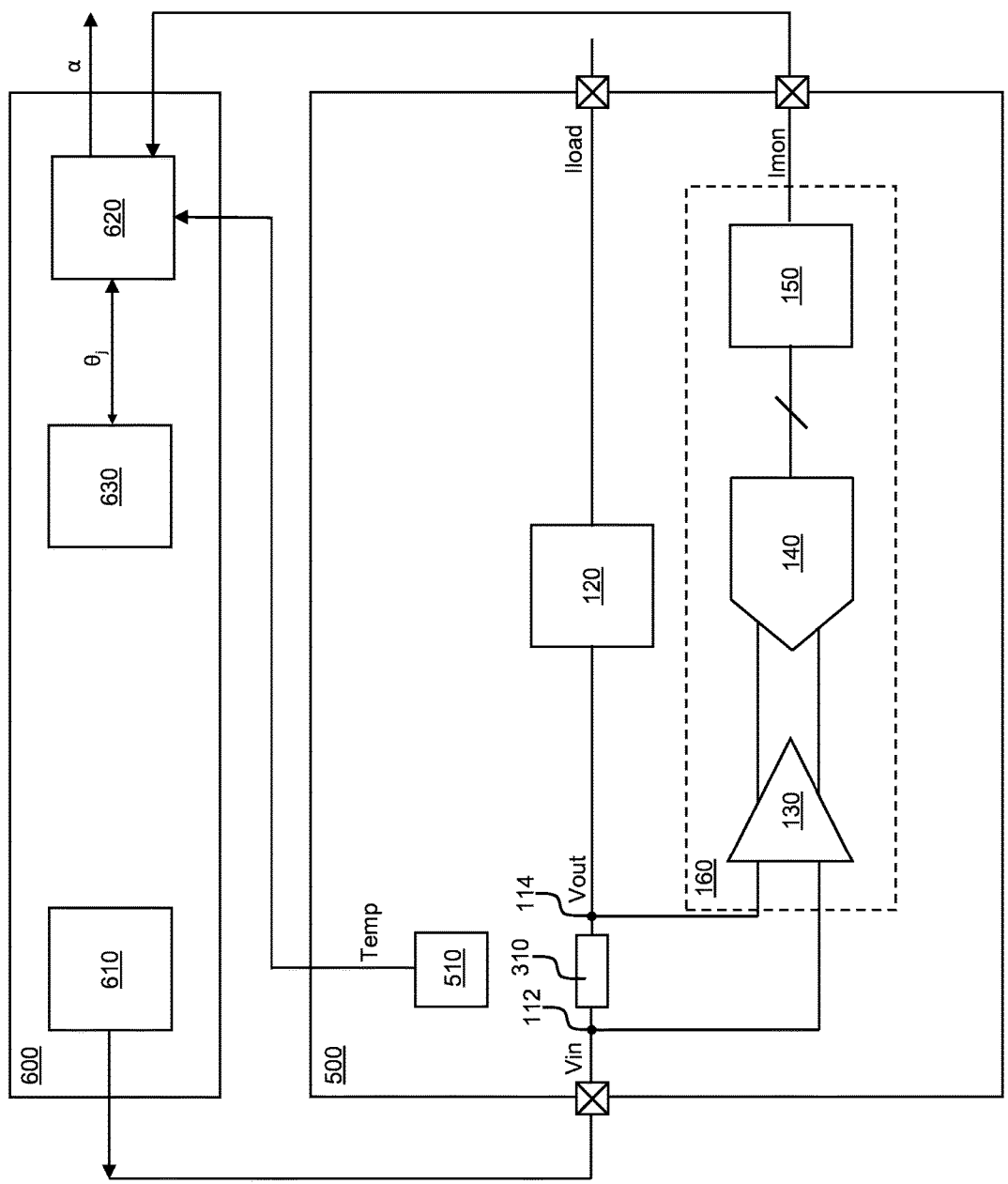
FIG. 5 is a schematic diagram illustrating an integrated circuit with current monitoring circuitry, an integrated current sense resistor and integrated temperature monitoring circuity, and circuitry for determining or estimating a temperature coefficient of the current sense resistor and/or a thermal resistance of an IC junction of the current sense resistor.

In an alternative example, illustrated in FIG. 5, a more accurate estimate of the thermal resistance $\theta_j$ may be derived using temperature sensing circuitry, which may be integrated into an IC, for example.

FIG. 5 shows an IC 500 which is similar to the IC 300 illustrated in FIG. 4. Like the IC 300 of FIG. 4, the IC 500 includes an integrated current sense resistor 310, processing circuitry 160 and circuitry 120 (e.g. power controller circuitry). The IC 500 further includes integrated temperature sensing circuitry 510 provided in the vicinity of the current sense resistor 310 and configured to provide a signal Temp, indicative of the junction temperature $T_j$ of the integrated current sense resistor 310. The temperature sensing circuitry may be, for example, a resistor with a known temperature coefficient (which may in some examples be implemented as metal strip), a diode, a transistor and/or any other device or circuitry suitable for providing the signal Temp.

FIG. 5 also shows circuitry 600 for determining a temperature coefficient of the integrated current sense resistor 310. The circuitry 600 includes signal generator circuitry 610 and processing circuitry 620.

Figure 6:
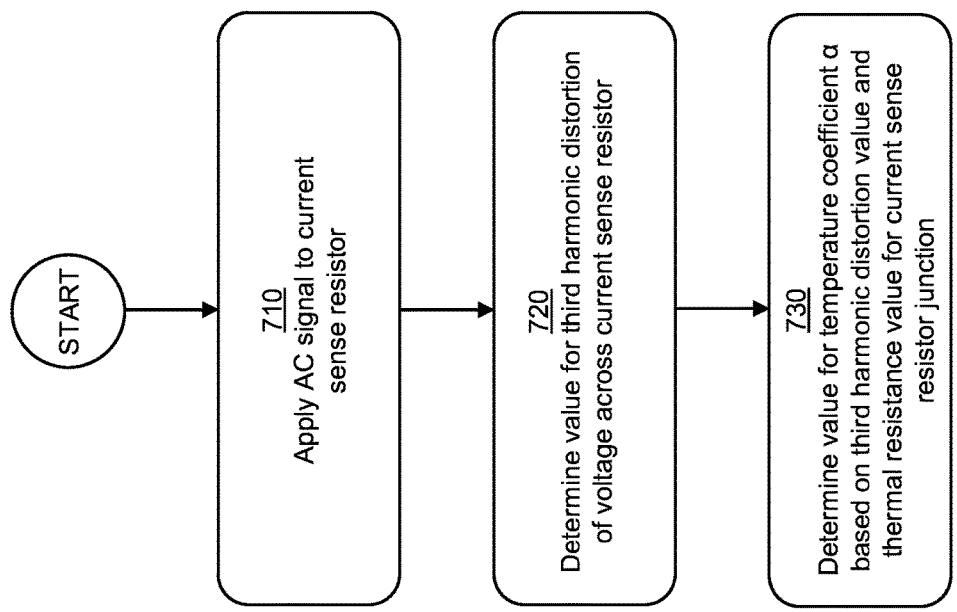
FIG. 6 is a flow chart illustrating steps in a method for determining a value of a temperature coefficient of a current sense resistor.

The circuitry 600 may be provided externally of the IC 500 as shown in FIG. 6. For example, the circuitry 600 may be provided in an IC that is separate from the IC 500. Alternatively, the circuitry 600 may be integrated with the current sense resistor 310 and the circuitry 120-160 and 510 in the IC 500.

The signal generator circuitry 610 is configured to supply a direct current (DC) signal of a predetermined constant voltage amplitude $V_{DC}$ to the current sense resistor 310 of the integrated circuit 500 for a predetermined period of time to provide a controlled thermal gradient across the current sense resistor 310, for use in estimating, calculating or otherwise determining the thermal resistance $\theta_j$ of the junction surrounding the current sense resistor 310.

The processing circuitry 620 is configured to sample the signal Temp at regular intervals so as to obtain a value $T_{j0}$ for the junction temperature at the start of the predetermined period of time and a value $T_{j1}$ for the junction temperature at the end of the predetermined period of time.

The thermal resistance $\theta_j$ can be calculated as:

$$\theta_j = \frac{\Delta T}{P_{DC}}, \quad (18)$$

where $\Delta T$ is a difference between a junction temperature $T_{j1}$ at the end of the predetermined period of time and a junction temperature $T_{j0}$ at the start of the predetermined period of time.

For a DC signal of a constant voltage amplitude $V_{DC}$, $$P_{DC} = \frac{(V_{DC} - V_{out})^2}{R} \quad (19)$$

The processing circuitry 620 can thus calculate, estimate or otherwise determine the value $P_{DC}$ from the signal Imon output by the DSP circuitry 150 and the nominal resistance value R of the current sense resistor 310.

Then, based on the samples of the signal Temp provided by the integrated temperature sensing circuitry 510 and the value $P_{DC}$, the processing circuitry 620 can calculate a value of the thermal resistance $\theta_j$, based on equation (18) above. This value may be stored by the processing circuitry 620 in memory 630 of the circuitry 600 for later use in determining the temperature coefficient $\alpha$ of the current sense resistor 310.

In some examples, instead of supplying the DC current signal to the current sense resistor 310 to provide a controlled thermal gradient across the current sense resistor 310, the signal generator circuitry 610 may supply the DC current signal to a resistive element (e.g. in the form of a metal layer) having a known resistance value R disposed in close proximity to the current sense resistor 310 on the IC die in order to achieve a measurable power dissipation in the resistive element and a resulting change (increase) in the temperature in the vicinity of the current sense resistor 310 (e.g. a change in the temperature of the junction surrounding the current sense resistor 310). This arrangement has the advantage that the current sense resistor 310 is not subjected to large DC currents which could affect its long-term reliability.

The signal generator circuitry 610 is further configured to supply an alternating current (AC) signal, e.g. a sinusoidal current signal, of a predetermined peak amplitude I to the current sense resistor 310 of the integrated circuit 500, for use in estimating, calculating or otherwise determining the temperature coefficient $\alpha$ of the current sense resistor 310.

The processing circuitry 620 is configured to operate in the manner described above with reference to FIG. 4, with the exception that instead of using a predefined value or estimate for the thermal resistance $\theta_j$, the processing circuitry 620 uses the value or estimate of the thermal resistance $\theta_j$ previously determined by the processing circuitry 620 based on the DC current that was injected into the current sense resistor 310.

FIG. 6 is a flow chart illustrating steps performed by the circuitry 400 or 600 to determine a value for the temperature coefficient $\alpha$ of the current sense resistor 310.

As step 710 the signal generator circuitry 410 or 610 generates an AC signal having a predetermined peak current magnitude, and outputs it to the current sense resistor 310. The AC signal may be a sinusoidal signal, for example.

At step 720 the processing circuitry 420 or 620 determines a value for the third harmonic distortion of a voltage across the current sense resistor 310 arising as a result of the applied AC signal, as described above.

At step 730 the processing circuitry 420 or 620 determines a value for the temperature coefficient $\alpha$ of the current sense resistor 310 based on the determined value for the third harmonic distortion and a thermal resistance value for the current sense resistor junction, as described above.

Figure 7:
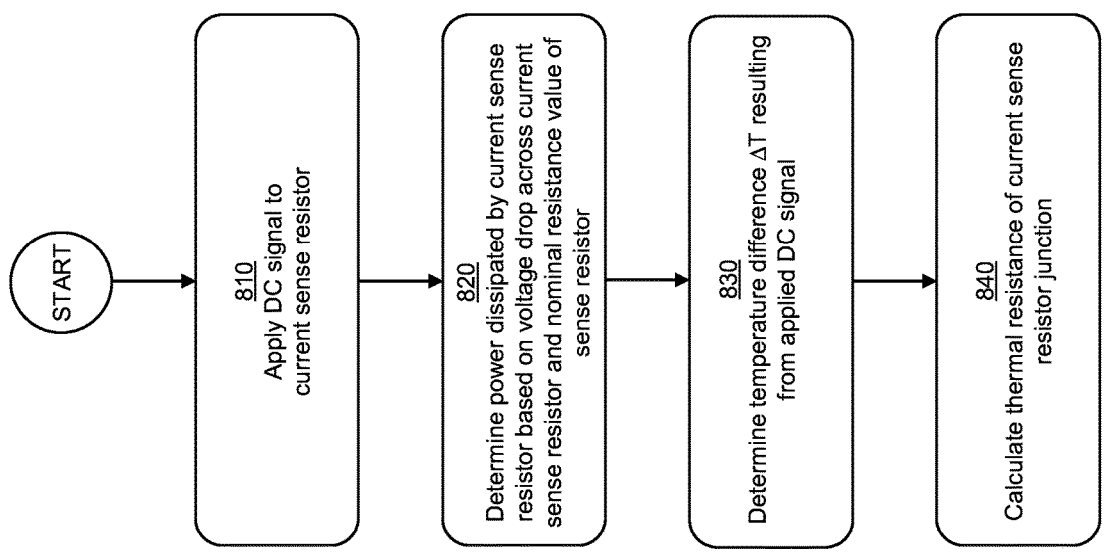
FIG. 7 is a flow chart illustrating steps in a method for determining a value of thermal resistance of an IC junction of a current sense resistor.

FIG. 7 is a flow chart illustrating steps performed by the circuitry 600 to determine a value for the thermal resistance $\theta_j$ of the junction surrounding the current sense resistor 310.

As step 810 the signal generator circuitry 610 generates a DC signal having a predetermined voltage amplitude $V_{DC}$, and outputs it to the current sense resistor 310 for a predetermined period of time, to cause the current sense resistor 310 to dissipate power as heat.

At step 820 the processing circuitry 220 determines the power $P_{DC}$ dissipated by the current sense resistor 310, based on a voltage drop across the current sense resistor 310 and the nominal resistance value R of the current sense resistor 310. As noted above, the signal Imon output by the DSP circuitry 150 is based on a digital signal indicative of the voltage drop across the current sense resistor 310 and a nominal resistance value of the current sense resistor 110. Thus, using the signal Imon and the nominal resistance value R of the current sense resistor 310, the processing circuitry 620 can calculate, estimate or otherwise determine the voltage drop across the current sense resistor 310, and can then calculate, estimate or otherwise determine the power $P_{DC}$ dissipated by the current sense resistor 310 based on the voltage drop across the current sense resistor 310 and the nominal resistance value R of the current sense resistor 310, using the relationship defined by equation (19) above.

Alternatively, the processing circuitry 620 may calculate, estimate or otherwise determine the power $P_{DC}$ dissipated by the current sense resistor 310 based on the value of a current through the current sense resistor 310 (represented by the signal Imon) and the nominal resistance value R of the current sense resistor 310, using the relationship $$P_{DC} = I_{RSense}^2 R, \quad (20)$$

where $I_{Rsense}$ is the current through the current sense resistor 310.

At step 830 the processing circuitry determines a temperature difference $\Delta T$ resulting from the DC signal applied to the current sense resistor 310, based on the signal Temp provided by the integrated temperature sensing circuitry 510.

At step 840 the processing circuitry 620 calculates, estimates or otherwise determines the thermal resistance $\theta_j$, based on values determined in steps 820 and 830 for the dissipated power PDC and temperature difference $\Delta T$.

Once the thermal resistance $\theta_j$ has been determined, the processing circuitry 620 may store it in the memory 630 of the circuitry 600 for later use in determining the temperature coefficient $\alpha$ of the current sense resistor 310, as described above.

The temperature coefficient $\alpha$ of the current sense resistor 310 may be used (e.g. by the processing circuitry 610) in conjunction with a measured junction temperature T2 of the current sense resistor 310 (as represented by the signal Temp) to estimate a resistance value $R_{T2}$ of the current sense resistor 310 at the measured junction temperature, based on equation (3), which is reproduced below:

$$R_{T2} = R_{T1}(1 + \alpha \Delta T) \quad (3)$$

The resistance value $R_{T2}$ of the current sense resistor 310 may then be transmitted to the DSP circuitry 150 for use in providing a more accurate estimate of the current through the current sense resistor 310 when the current sense resistor 310 is at temperature T2. Thus the current monitoring circuitry 100 can be dynamically calibrated as the temperature of the current sense resistor 310 changes to improve the accuracy of the estimate of the current through the current sense resistor 310.

The techniques described above can be used during a production test process for the IC 500 to calculate, estimate or otherwise determine a temperature coefficient $\alpha$ of the current sense resistor 310 without adjusting the ambient temperature of the test environment. The determined temperature coefficient α may then be stored, e.g. in the DSP circuitry 150 or the memory 630 of the circuitry 600, for later use in determining an updated estimate of the resistance value of the current sense resistor 310 when the junction temperature of the current sense resistor 310 changes.

Figure 1:
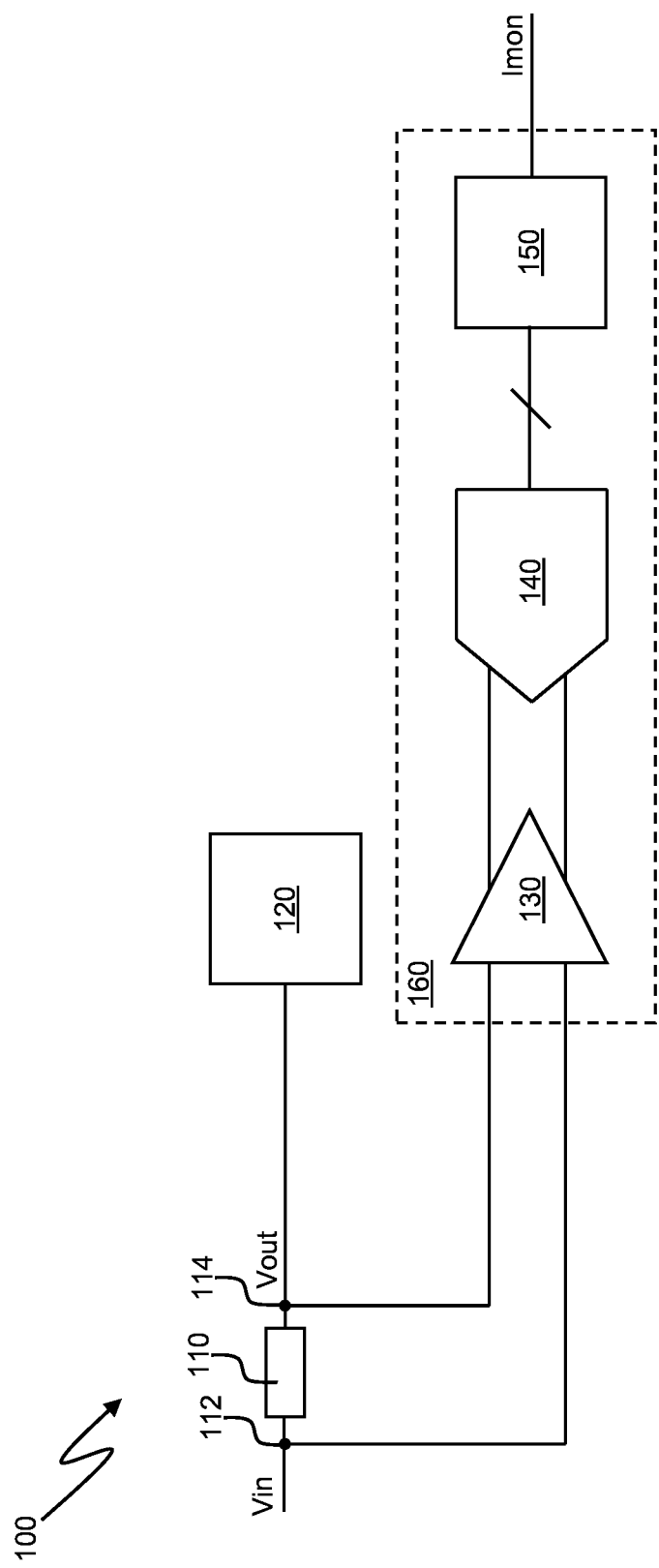
FIG. 1 is a schematic diagram illustrating example current monitoring circuitry.
Figure 2:
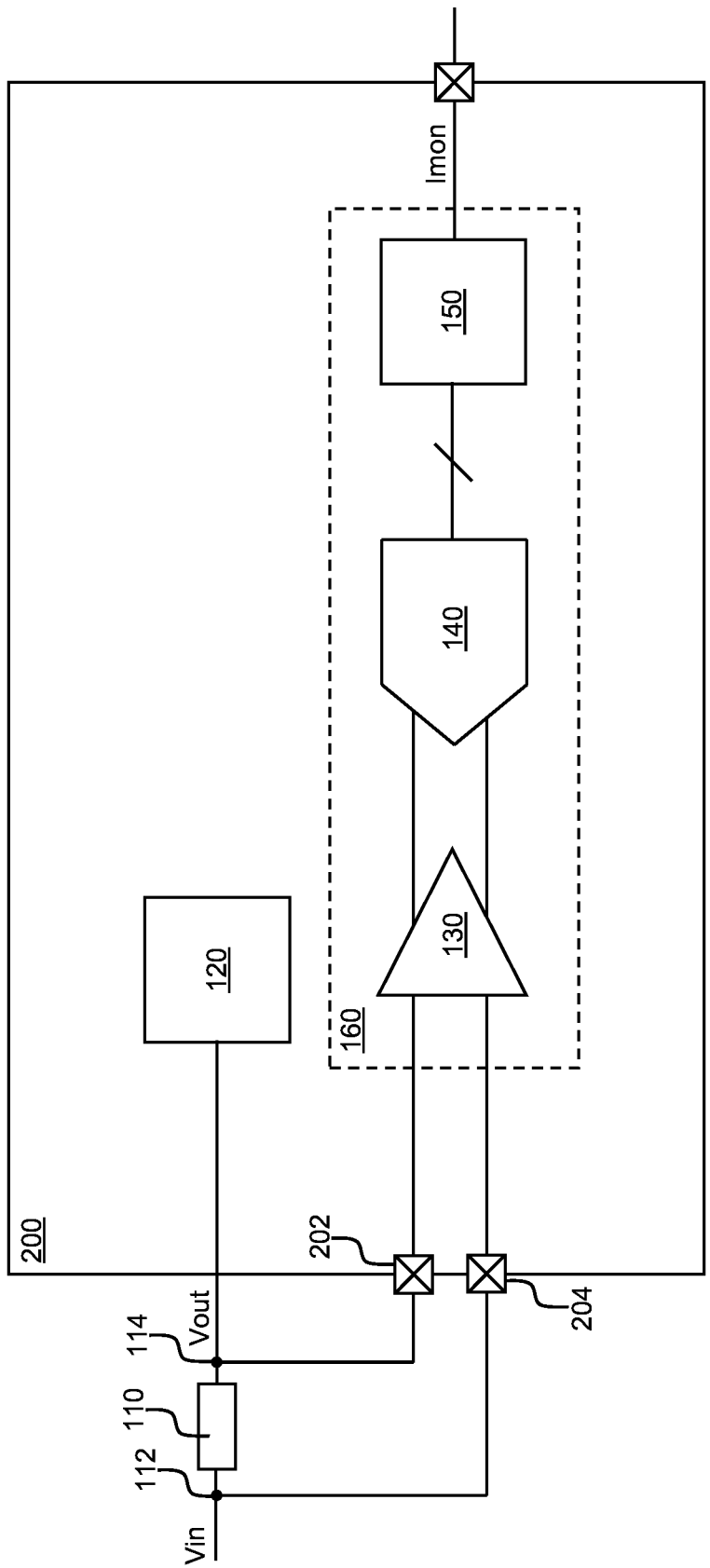
FIG. 2 is a schematic diagram illustrating an integrated circuit with current monitoring circuitry and an external current sense resistor.

In the foregoing description the current sense resistor 310 has been described as being an integrated resistor. However, it will be appreciated by those of ordinary skill in the art that the techniques described above can equally be used to calculate, estimate or otherwise determine a temperature coefficient α of a resistor that is not integrated into an integrated circuit (i.e. an external resistor of the kind shown, e.g. at 110 in FIGS. 1 and 2) and to calculate, estimate or otherwise determine a thermal resistance $\theta_j$ of a junction (e.g. a portion of a printed circuit board or other substrate on which the resistor is mounted) of such an external resistor. Thus the invention is not limited to determining the temperature coefficient α or the thermal resistance $\theta_j$ for an integrated resistor.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product. In some instances the device could be a gaming device such as a games console, or a virtual reality (VR) or augmented reality (AR) device such as a VR or AR headset, spectacles or the like.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for determining a temperature coefficient value of a resistor, the circuitry comprising:
   circuitry for supplying an AC current signal to the resistor;

circuitry for measuring a first voltage across the resistor when the AC current signal is supplied; and processing circuitry configured to determine the temperature coefficient value based on a thermal resistance value of a junction surrounding the resistor and a harmonic distortion value of the first voltage.

2. Circuitry according to claim 1, wherein the resistor is an integrated resistor of an integrated circuit.

3. Circuitry according to claim 1, wherein the harmonic distortion value is a third harmonic distortion value or a second harmonic distortion value.

4. Circuitry according to claim 1, wherein the thermal resistance value is a predefined value based on material properties of the junction.

5. Circuitry according to claim 1, wherein the circuitry further comprises:

circuitry for supplying a DC current signal to a resistive element for a predefined period of time to dissipate power in the resistive element; and circuitry for measuring a second voltage across the resistive element when the DC current signal is supplied, wherein the processing circuitry is further configured to estimate a power dissipated by the resistive element in the predetermined period of time based on the second voltage.

6. Circuitry according to claim 5, wherein the processing circuitry is further configured to estimate the power dissipated by the resistive element in the predetermined period of time based on the second voltage and a resistance value of the resistive element.

7. Circuitry according to claim 5, wherein the processing circuitry is further configured to estimate a thermal resistance value of a junction surrounding the resistor based on the estimated power dissipated and a measured change in a temperature in the vicinity of the resistor over the predefined period of time.

8. Circuitry according to claim 7, wherein the processing circuitry is configured to determine the temperature coefficient value based on the estimated thermal resistance value and the first voltage.

9. Circuitry according to claim 7, wherein the circuitry comprises temperature sensing circuitry configured to output one or more signals indicative of the measured change of temperature to the processing circuitry.

10. Circuitry according to claim 9, wherein the temperature sensing circuitry comprises one or more of:
a resistor having a known temperature coefficient;
a diode; and
a transistor.

11. Circuitry according to claim 5, wherein the resistive element comprises the resistor.

12. Circuitry according to claim 5, wherein the DC current signal comprises a signal of a constant amplitude.

13. Circuitry according to claim 1, wherein the AC current signal comprises a sinusoidal current signal.

14. Circuitry according to claim 1, wherein a temperature to resistance transfer function of the resistor comprises a polynomial function comprising a plurality of different temperature coefficients, each associated with a polynomial term of the polynomial function.

15. An integrated circuit comprising circuitry according to claim 1.

16. An integrated circuit according to claim 15, further comprising an integrated current sense resistor.

17. An integrated circuit according to claim 16, further comprising an integrated current sense resistor.

18. An electronic device comprising an integrated circuit according to claim 17.

19. An electronic device according to claim 18, wherein the electronic device comprises a mobile telephone, a tablet or laptop computer, a wearable device, a gaming device, a virtual reality or augmented reality device.

20. Circuitry for determining a thermal resistance value of a junction surrounding a resistor, the circuitry comprising:

circuitry for supplying a DC current signal to a resistive element for a predefined period of time to dissipate power in the resistive element; and circuitry for measuring a voltage across the resistive element when the DC current signal is supplied, wherein the processing circuitry is further configured to:

estimate a power dissipated by the resistive element in the predetermined period of time based on the measured voltage and a resistance value of the resistive element; and estimate a thermal resistance value of the junction surrounding the resistor based on the estimated power dissipated and a measured change in a temperature in the vicinity of the resistive element over the predefined period of time.

21. Circuitry according to claim 20, wherein the resistive element comprises the resistor.

22. Circuitry according to claim 20, wherein the DC current signal comprises a signal of a constant amplitude.

23. Circuitry according to claim 20, wherein the resistor is an integrated resistor of an integrated circuit.

24. An integrated circuit comprising circuitry according to claim 20.

25. A method for determining a temperature coefficient value of a resistor, the method comprising:
supplying an AC current signal to the resistor;
measuring a first voltage across the resistor when the AC current signal is supplied; and
determining the temperature coefficient value based on a thermal resistance value of a junction surrounding the resistor and a harmonic distortion value of the first voltage.

26. A method according to claim 25, wherein the method further comprises:
determining a temperature associated with the resistor; and
estimating a resistance value of the resistor at the determined temperature based on a reference resistance value of the resistor, the determined temperature, and the temperature coefficient value.

27. A method according to claim 26, wherein the resistor is a current sense resistor of current sense circuitry, wherein the method further comprises dynamically calibrating the current sense circuitry based on the estimated resistance value at the determined temperature.

28. A method according to claim 26, further comprising estimating a current through the resistor based on the estimated resistance value at the determined temperature.

29. A method for determining a thermal resistance value of a junction surrounding a resistor, the method comprising:
supplying a DC current signal to a resistive element for a predefined period of time to dissipate power in the resistive element;
measuring a voltage across the resistive element when the DC current signal is supplied;

estimating a power dissipated by the resistive element in the predetermined period of time based on the measured voltage and a resistance value of the resistive element; and estimating a thermal resistance value of the junction surrounding the resistor based on the estimated power dissipated and a measured change in a temperature in the vicinity of the resistive element over the predefined period of time.

* * * * *